US008202364B2

(12) United States Patent
Lee et al.

(10) Patent No.: US 8,202,364 B2
(45) Date of Patent: Jun. 19, 2012

(54) METHOD FOR SOLID-STATE SINGLE CRYSTAL GROWTH

(75) Inventors: Ho-Yong Lee, Seoul (KR); Jong-Bong Lee, Chunan (KR); Tae-Moo Hur, Asan (KR); Dong-Ho Kim, Seoul (KR)

(73) Assignee: Ceracomp Co., Ltd., Asan (KR)

( * ) Notice: Subject to any disclaimer, the term of this patent is extended or adjusted under 35 U.S.C. 154(b) by 566 days.

(21) Appl. No.: 12/389,117

(22) Filed: Feb. 19, 2009

(65) Prior Publication Data

US 2009/0211515 A1 Aug. 27, 2009

Related U.S. Application Data

(63) Continuation-in-part of application No. 10/507,819, filed as application No. PCT/KR03/02078 on Oct. 9, 2003, now abandoned.

(30) Foreign Application Priority Data

Oct. 11, 2002 (KR) .................. 10-2002-0062033
Oct. 8, 2003 (KR) .................. 10-2003-0069867

(51) Int. Cl.
C30B 15/14 (2006.01)
C30B 1/00 (2006.01)
C30B 3/00 (2006.01)
C30B 5/00 (2006.01)
C30B 28/02 (2006.01)
(52) U.S. Cl. ..................... 117/7; 117/3; 117/4
(58) Field of Classification Search .............. 117/7, 3, 117/4
See application file for complete search history.

(56) References Cited

U.S. PATENT DOCUMENTS

| 4,339,301 A | * | 7/1982 | Matsuzawa et al. ............. 117/7 |
| 4,402,787 A | * | 9/1983 | Matsuzawa et al. ............. 117/7 |
| 4,519,870 A | | 5/1985 | Matsuzawa et al. |
| 4,900,393 A | | 2/1990 | Kugimiya et al. |
| 5,114,528 A | | 5/1992 | Kou |
| 5,439,876 A | | 8/1995 | Graf et al. |
| 5,541,764 A | | 7/1996 | Zhu et al. |
| 5,611,854 A | | 3/1997 | Veal et al. |
| 5,804,907 A | | 9/1998 | Park et al. |
| 5,998,910 A | | 12/1999 | Park et al. |

(Continued)

FOREIGN PATENT DOCUMENTS

JP  44-8557  4/1969

(Continued)

OTHER PUBLICATIONS

Ho-Yong Lee et al., Fabrication of BaTiO3 Single Crystals Using Secondary Abnormal Grain Growth, Journal of the European Ceramic Society, Sep. 1, 2000, pp. 1595-1597, vol. 20, No. 10.

(Continued)

Primary Examiner — James McDonough
(74) Attorney, Agent, or Firm — Browdy and Neimark, PLLC

(57) ABSTRACT

By controlling the average size of matrix grains of polycrystalline bodies to more than a critical size at which an abnormal, exaggerated or discontinuous grain growth ends, and less than twice the critical size, large single crystals enough for practical use may be made even without occurring abnormal grain growth in polycrystalline bodies only through a heat treatment process without using a melting process and a special apparatus, thereby allowing the mass production of the large single crystals at low costs with high reproduction possibility.

11 Claims, 8 Drawing Sheets

U.S. PATENT DOCUMENTS

| | | | |
|---|---|---|---|
| 6,048,394 | A | 4/2000 | Harmer et al. |
| 6,103,072 | A * | 8/2000 | Nishiwaki et al. ....... 204/192.18 |
| 6,355,185 | B1 | 3/2002 | Kubota |
| 6,482,259 | B1 * | 11/2002 | Lee et al. .......................... 117/3 |
| 2002/0179000 | A1 * | 12/2002 | Lee et al. .......................... 117/4 |
| 2005/0150446 | A1 * | 7/2005 | Lee et al. ........................ 117/54 |

FOREIGN PATENT DOCUMENTS

| | | |
|---|---|---|
| JP | 44-20308 | 9/1969 |
| JP | 59021591 | 2/1984 |
| JP | 61-091091 | 5/1986 |
| JP | 61-146779 | 7/1986 |
| JP | 61-146780 | 7/1986 |
| JP | 63-035496 | 2/1988 |
| JP | 04-042855 | 2/1992 |
| JP | 04-300296 | 10/1992 |
| JP | 06-056595 | 3/1994 |
| JP | 09-263496 | 10/1997 |
| JP | 200196261 A | 7/2001 |
| KP | 00143799 B1 | 4/1998 |
| WO | 0106042 A1 | 1/2001 |
| WO | 0163021 A1 | 8/2001 |
| WO | WO 0163021 A1 | 8/2001 |

OTHER PUBLICATIONS

W.E. Benson, et al., The Effect of Initial Grain Size Distribution on Abnormal Grain Growth in Single-Phase Materials, Acta Materialia, Sep. 18, 1998, pp. 5323-5333, vol. 46, No. 15.

M. Hiller et al., On the Theory of Normal and Abnormal Grain Growth, Acta Metallurgica, Mar. 1965, pp. 227-238, vol. 13, No. 3.

Y.J. Park, Abnormal Growth of Faceted Grains in Liquid Matrix, Materials Science Forum, 1996, pp. 411-416, vols. 204-206.

U.S. Appl. No. 10/845,095, filed May 14, 2004, Lee et al.

Helmut Schmelz et al., The evidence for anomalous grain growth below the eutectic temperature in $BaTiO_3$ ceramics, article, May 1955, 9 p.

Takahisa Yamamoto et al., Fabrication of Barium Titanate Single Crystals by Solid-State Grain Growth, journal, Apr. 1994, 3 p., vol. 77, No. 4, Journal of the American Ceramic Society, Tokyo, Japan.

Von Hermann Pfisterer, Elektronenmikroskopische Bruchgefugeuntersuchungen an Sinterwerkstoffen, article, May 1955, 7p.

W.D. Kingery et al., Introduction to Ceramics, book, 1976, 12 p., $2^{nd}$ Ed., John Wiley & Sons, Inc., United States.

\* cited by examiner

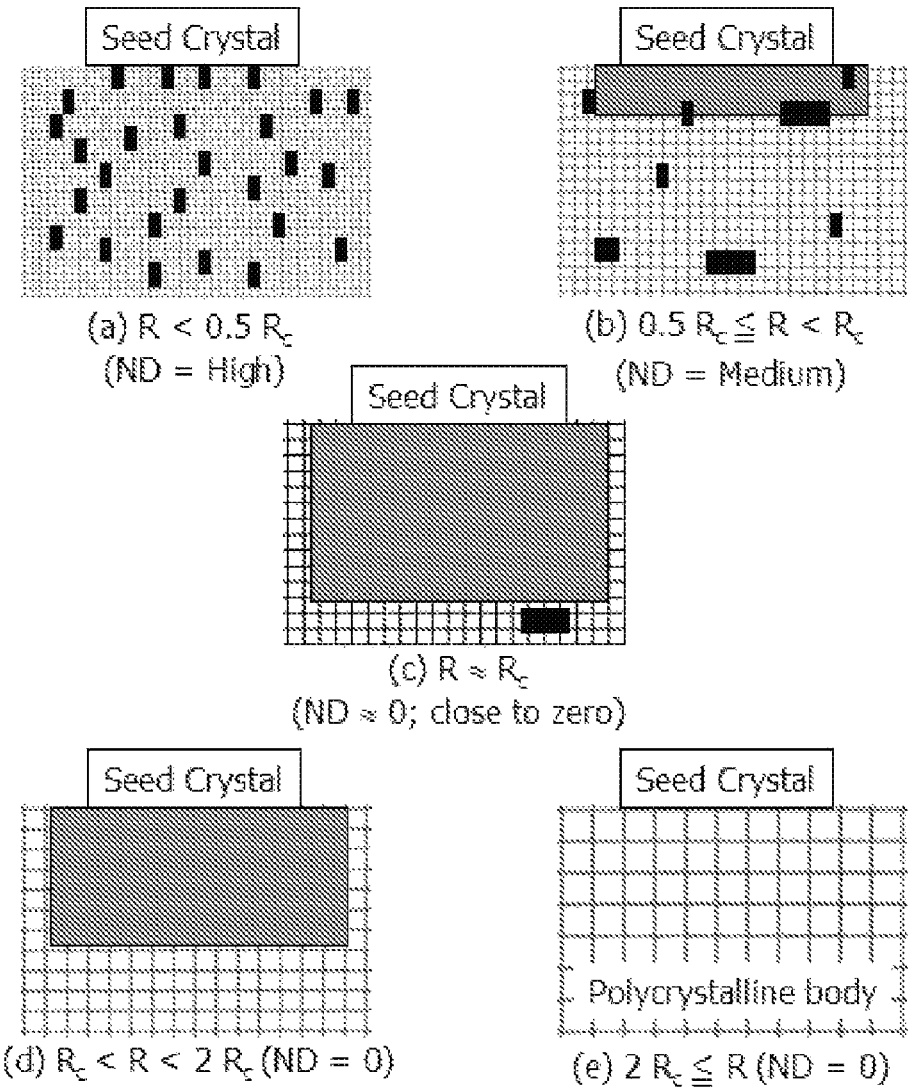

Fig. 2 A schematic view showing the changes of the number density (ND) and growth behavior of seed single crystals according to the changes of the average size (R) of matrix grains in the polycrystalline bodies.
(R: average size of matrix grains; $R_c$: Critical average size of matrix grains for abnormal grain growth
■: abnormal grains;  ▧: grown single crystals;
⊞: indicating the size of matrix grains)

METHOD FOR SOLID-STATE SINGLE CRYSTAL GROWTH

BACKGROUND

1. Field

The disclosure relates to a method for growing single crystals, and more particularly to a method for growing single crystals by making the average size of matrix grains of polycrystalline bodies to more than a critical size at which an abnormal, exaggerated or discontinuous grain growth ends and no abnormal grains exist [or the number density (ND) of the abnormal grains (number of abnormal grains/unit area) become zero], and less than twice the critical size, thereby enhancing growth of a seed single crystal into a polycrystalline body without any impingement between a growing seed single crystal and abnormal grains.

2. Background of the Related Art

The single crystals are generally manufactured by using a melting process. Accordingly, a general method for single crystal growth using the melting process is referred to as a Liquid-State Single Crystal Growth (LSCG) method.

Contrary to the general liquid-state single crystal growth method, a method for producing the single crystals by using a grain growth of matrix grains without the melting process of their major components is referred to as a Solid-State Single Crystal Growth (SSCG) method. Herein, the grain growth may occur during heat treatment of the polycrystalline bodies.

The SSCG method has been suggested since the 1950's and was practiced in producing single crystals of a metal, which is limited only a few types. It is, however, reported that when the single crystals are produced by the grain growth in oxide materials, the method has a difficulty in manufacturing single crystals big enough for practical use from the oxide.

Meanwhile, there has been made an attempt to obtain single crystals by heat-treating polycrystalline bodies of ferrite, barium titanate ($BaTiO_3$), aluminum oxide ($Al_2O_3$), PMN-PT, etc. through the solid-state single crystal growth method. This is a method for growing seed single crystals in polycrystalline bodies, which involves sintering powder-molded bodies impregnated with seed single crystals or forming an interface between the polycrystalline body and the seed single crystal, followed by heat treatment. However, the method is not suitable to preparing single crystals big enough for practical uses such as several tens mm.

SUMMARY

According to the embodiments of the invention, large single crystals enough for practical use having a large size such as about 30~80 mm size or a size more than about 50 mm and about 80 mm or less can be easily made without occurring abnormal grain growth in polycrystalline bodies only through a heat treatment process without using a melting process, a special apparatus, complex and difficult adjustment of abnormal grain growth including repressing the abnormal grain growth in the polycrystalline body and causing the abnormal grain growth at the interface between the seed single crystal and the polycrystalline body, thereby allowing the mass production of the large single crystals easily at low costs with high reproduction possibility.

Disclosed herein is, in an embodiment, a method for growing large single crystals through Solid-State Single Crystal Growth (SSCG) without occurring abnormal grain growth in polycrystalline bodies wherein the method may include making the average size of matrix grains of polycrystalline body to have more than a critical size at which an abnormal, exaggerated or discontinuous grain growth ends and no abnormal grains exist [or the number density (ND) of the abnormal grains (number of abnormal grains/unit area) become zero], and less than twice the critical size; adjoining a seed single crystal to the polycrystalline body; and heat-treating the seed single crystal and polycrystalline body to continue to grow the seed single crystal into the polycrystalline body.

Through the method, large single crystals enough for practical use having a large size such as about 30~80 mm size or a size more than 50 mm and 80 mm or less may be obtained by continuously growing without any occurrence of abnormal grains in the polycrystalline body, which means that the method is free from complex and difficult adjustments of abnormal grain growth including repressing the abnormal grain growth in the polycrystalline body and causing the abnormal grain growth at the interface between the seed single crystal and the polycrystalline body.

BRIEF DESCRIPTION OF THE DRAWINGS

The above and other features and advantages of the disclosed embodiments will be more apparent from the following detailed description taken in conjunction with the accompanying drawings in which:

FIG. 2 is a schematic view showing the changes of the number density of abnormal grains and the degree of the seed single grain growth according to the changes of the average size of matrix grains in the polycrystalline body;

DETAILED DESCRIPTION OF EMBODIMENTS

Figure 1:
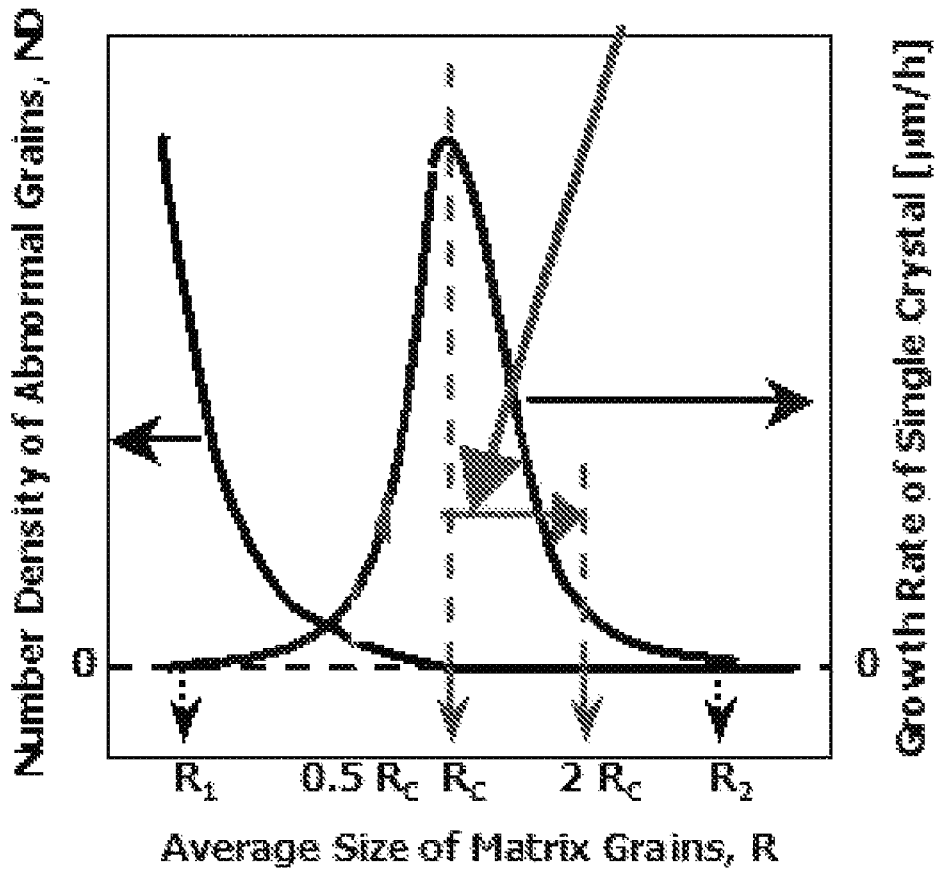
FIG. 1 is a graph showing a continuous growth condition of a seed single crystal ($R_c<R<2R_c$) where R is the average size of matrix grains and $R_c$ is a critical size of the matrix grains at which an abnormal grain growth ends and no abnormal grains exist.

Hereinafter, embodiments of a solid-state single crystal growth method according to the present invention will be described in more details with reference to the accompanying drawings.

Abnormal grain growth is totally prevented beyond a critical average size of matrix grains.

The method for growing single crystals of materials without occurring abnormal grain growth in polycrystalline bodies according to the embodiments involves making the average size (R) of matrix grains of a polycrystalline body to be more than $R_c$ and less than $2R_c$ (i.e., $R_c<R<2R_c$) ($R_c$: the critical size of matrix grains at which abnormal grain generation ends).

A seed single crystal continues to be grown into the polycrystalline body by adjoining the seed single crystal to the polycrystalline body in which the generation of abnormal grains is totally prevented, and then heat-treating the combination.

When the average size of matrix grains of the polycrystalline body is $R_c$ or less, there still occur abnormal grain growth in the polycrystalline body although abnormal grain growth can be repressed in the polycrystalline body. Also, when the average size of matrix grains is $2R_c$ or more, it is difficult to grow a large single crystal because a growth rate of the single crystal is too slow although there exists no abnormal grain growth in the polycrystalline body.

There are various factors affecting the abnormal grain growth and the average size of matrix grains of the polycrystalline body. It is very difficult to control the various individual factors at the same time, which means that there needs a criterion to simplify such control of the factors.

The average size of matrix grains may be varied by adding one or more specific components among components of matrix grains of the polycrystalline body so that the polycrystalline body contains the specific components in an amount higher or lower than its content in the original composition of the polycrystalline body. For example, the average size of matrix grains may be reduced if excess $TiO_2$ to $Ba(Ti,Zr)O_3$ ceramics is added.

In addition, the average size of matrix grains may be varied by changing a ratio of components of matrix grains of polycrystalline body or adding one or more additives different from the components of matrix grains of polycrystalline body to the polycrystalline body.

Additionally, the average size of matrix grains of polycrystalline body may be varied by pre-heat treating the polycrystalline body at the temperatures different from a sintering atmosphere for abnormal grain growth.

The average size may be also varied according to a density of the polycrystalline body or a pressure during pressure sintering.

Since there are many factors to affect the average size of matrix grain and they are also related to the abnormal grain growth, it is hard to control the abnormal grain growth together with the average size of matrix grain and obtain a large single crystal if the factors are randomly and individually controlled.

In the embodiments, a simple and useful means can be provided to obtain the large single crystal without considering each and every factors and without occurrence of the abnormal grain growth in the polycrystalline body. The simple and useful means involves making the average size (R) of matrix grains of a polycrystalline body to be more than $R_c$ and $2R_c$ or less The adjoining of the seed single crystal to the polycrystalline body where the average size of matrix grains are set to have the range and growing of the seed single crystal into the polycrystalline body may include placing the seed single crystal on a powder-molded body or sintered body, embedding the seed single crystal in the powder, or adjoining the sintered body to the seed single crystal and then embedding the combination in the powder.

Meanwhile, a single crystal having the same crystallographic structure as that of the polycrystalline body can be used as the seed single crystal.

When a polycrystalline thin film on the surface of the seed single crystal is grown and the average size of the matrix grains in the thin film is adjusted during or after the thin film growth, the seed single crystal is continuously grown into the thin film during heat-treatment. Accordingly, it is possible to produce a new thin film single crystal on the seed single crystal.

If the polycrystalline thin film on the seed single crystal is dense, it is possible to produce a perfectly dense single crystal thin film regardless of the density of the seed single crystal. If the composition of the polycrystalline thin film is different from that of the seed single crystal, it is possible to produce a new single crystal thin film having a composition different from that of the seed single crystal.

Meanwhile, when it is required to produce a single crystal having a desired crystal orientation, it is possible to change a crystal orientation of a single crystal to be grown into the polycrystalline body from the seed single crystal by predetermining a crystal orientation of the seed single crystal prior to adjoining the seed single crystal to the polycrystalline body, grinding a specific crystal face of the seed single crystal in the crystal orientation determined, and adjoining the ground seed single crystal to the polycrystalline body.

In addition, when it is required to produce a single crystal comprising specific defects, it is possible to produce a single crystal comprising the same defects as those of the seed single crystal by using the seed single crystal comprising defects such as a single twin boundary, a double twin boundary, and a low angle grain boundary, etc.

Meanwhile, it is possible to produce a single crystal having a desired complex shape without a separate step of processing of the single crystal by using the powder that was molded or processed to a desired shape or a complex shape as the polycrystal.

In addition, it is possible to control the porosity, the pore size and the pore shape inside the single crystal to be grown in the polycrystalline body and to produce perfectly dense single crystals destitute of pores and single crystals having various porosities, by adjoining a polycrystalline body having a different porosity, pore size and pore shape which was produced by adding an additive to the polycrystalline body or changing the amount of a liquid phase, sintering temperature, sintering atmosphere (oxygen partial pressure, degree of vacuum, etc.) and sintering pressure to the seed single crystal, and heat-treating the combination of the polycrystalline body and the seed single crystal.

Also, it is possible to produce a single crystal having a structure which the pores are therein but not in the surface of thereof, by placing the seed single crystal on the polycrystalline body comprising the pores, heat-treating the combination, and growing the single crystal, thereby forming a perfectly dense layer on a surface of the single crystal.

Additionally, as the polycrystalline body, it is possible to use a solid solution to which are added one or more selected from the group consisting of additives forming a solid solution with a crystallographic structure of the polycrystalline body.

In addition, in order to obtain a single crystal having a composition gradient, it is possible to produce a single crystal having a composition gradient that changes discontinuously or continuously, by making use of a polycrystalline body to which are added one or more selected from the group consisting of solutes to be solved into the crystallographic structure of the polycrystalline body composition.

The polycrystalline bodies comprise, for example, barium titanate ($BaTiO_3$), barium titanate solid solution (($Ba_xM_{1-x}$)($Ti_yN_{1-y}$)$O_3$) ($0 \leq x \leq 1$; $0 \leq y \leq 1$), $Pb(Zr_xTi_{1-x})O_3$ ($0 \leq x \leq 1$) (PZT) or PZT solid solution (($Pb_x,M_{1-x}$)($Zr_aTi_bN_c$)$O_3$ ($0 \leq x \leq 1$; $0 \leq a, b, c \leq 1$; $a+b+c=1$)), and other perovskite-type compositions ($PbTiO_3$ [PT], $(1-x)Pb(Mg_{1/3}Nb_{2/3})O_3$-$xPbTiO_3$ [$(1-x)$PMN-$x$PT], $(1-x-y)Pb(Mg_{1/3}Nb_{2/3})O_3$-$x$PbTiO$_{3-y}$PbZrO$_3$ [$(1-x-y)$PMN-$x$PT-$y$PZ], $(1-x-y)Pb(Yb_{1/2}Nb_{1/2})O_{3-x}$PbTiO$_{3-y}$PbZrO$_3$ [$(1-x-y)$PYbN-$x$PT-$y$PZ], $(1-x-y)Pb(In_{1/2}Nb_{1/2})O_3$-$x$PbTiO$_3$-$y$PbZrO$_3$ [$(1-x-y)$PIN-$x$PT-$y$PZ], $(1-x-y)$PYbN-$x$PMN-$y$PT and $(1-x-y)$PIN-$x$PMN-$y$PT) ($0 \leq x \leq 1$; $0 \leq y \leq 1$; $0 \leq x+y \leq 1$), perovskite-type solid solution, lead-free perovskites such as $K(Na_{0.5}Nb_{0.5})O_3$ [KNN] and $(Na_{0.5}Bi_{0.5})TiO_3$—$BaTiO_3$ [NBT-BT]; and lead-free perovskite solid-solutions such as KNN solid solution and NBT-BT solid solution.

For example, when the polycrystalline body is the $BaTiO_3$ or $BaTiO_3$ solid solution, it is preferable to make the average size of matrix grains of polycrystalline body to have more than 90 μm (the critical size) and less than 180 μm.

When the polycrystalline body is the PMN-PT or PMN-PT solid solution, it is preferable to make the average size of matrix grains of polycrystalline body to have more than 100 μm (the critical size) and less than 200 μm.

When the polycrystalline body is the PZT or PZT solid solution, it is preferable to make the average size of matrix grains of polycrystalline body to have more than 35 μm (the critical size) and less than 70 μm.

When the polycrystalline body is the PMN-PT-PZ or PMN-PT-PZ solid solution, it is preferable to make the average size of matrix grains of polycrystalline body to have more than 60 μm (the critical size) and less than 120 μm.

When the polycrystalline body is the PYbN-PT-PZ or PYbN-PT-PZ solid solution, it is preferable to make the average size of matrix grains of polycrystalline body to have more than 70 μm (the critical size) and less than 140 μm.

When the polycrystalline body is the PIN-PT-PZ or PIN-PT-PZ solid solution, it is preferable to make the average size of matrix grains of polycrystalline body to have more than 50 μm (the critical size) and less than 100 μm.

When the polycrystalline body is the PMN-PYbN-PT or PMN-PYbN-PT solid solution, it is preferable to make the average size of matrix grains of polycrystalline body to have more than 90 μm (the crystal size) and less than 180 μm.

When the polycrystalline body is the PMN-PIN-PT or PMN-PIN-PT solid solution, it is preferable to make the average size of matrix grains of polycrystalline body to have more than 80 μm (the critical size) and less than 160 μm.

When the polycrystalline body is the KNN or KNN solid solution, it is preferable to make the average size of matrix grains of polycrystalline body to have more than 25 μm (the critical size) and less than 50 μm.

When the polycrystalline body is the NBT-BT or NBT-BT solid solution, it is preferable to make the average size of matrix grains of polycrystalline body to have more than 15 μm (the critical size) and less than 30 μm.

Hereinafter, a method for producing large single crystals according to the embodiments of the invention will be described more in details with reference to the accompanying drawings.

A method for growing single crystals without occurring abnormal grain growth in polycrystalline bodies according to embodiments may include (i) making an average size of matrix grain in the polycrystalline body materials to have more than $R_c$ and less than $2R_c$ (i.e., $R_c<R<2R_c$) ($R_c$: the critical size of matrix grains at which abnormal grain generation ends), (ii) adjoining a seed single crystal having the same crystallographic structure as that of the polycrystalline body to the polycrystalline body and then (iii) heat-treating the combination of the seed single crystal and the polycrystalline body.

The single crystal obtained by the method has the same chemical composition as that of the original polycrystalline body with the seed single crystal adjoined thereto, and the same crystallographic structure as that of the seed single crystal.

Accordingly, in the method, the single crystal obtained by using the seed single crystal is the single crystal that has the chemical composition of the polycrystalline body and the crystallographic structure of the seed single crystal. Such a single crystal is herein referred to as "a single crystal having composition of the polycrystalline body".

The single crystals having various compositions produced according to embodiments can be used as a seed single crystal in another method.

In other words, another single crystal having composition of a polycrystalline body can be produced by adjoining a single crystal produced according to embodiments to a polycrystalline body, and then allowing the same structure as the seed single crystal to continue to be grown in the polycrystalline body. Accordingly, this recycling of single crystals can reduce the cost for the seed single crystals.

FIG. 1 is a schematic views that show a correlation between an average size (R) of matrix grains and a number density (ND, number of abnormal grains/unit area) of abnormal grains, and an average size (R) of matrix grains and a growth rate of a single crystal (a), and a continuous growth condition of a seed single crystal in the polycrystalline body without occurrence of abnormal grain growth in the polycrystalline body ($R_c<R<2R_c$) ($R_c$: the critical size of matrix grains at which an abnormal grain growth ends and no abnormal grains exist or a number density (ND, number of abnormal grains/unit area) of abnormal grains becomes zero.

FIG. 1 shows a continuous growth condition of a seed single crystal in the polycrystalline body without occurrence of abnormal grain growth in the polycrystalline body (i.e. $R_c<R<2R_c$) where a single crystal can be grown to a size such as about 30~80 mm size or a size more than about 50 mm and about 80 mm or less in the polycrystalline body.

Specifically, when the average size (R) of matrix grains of the polycrystalline body is smaller than the critical average size ($R<R_c$), as the average size decreases, generated abnormal grains collide with the growing single crystal, thereby obstructing the single crystal growth.

Meanwhile, when the average size (R) of matrix grains is larger than $R_c$ ($R_c<R$) the number density of abnormal grains is zero and the abnormal grain growth does not occur. However, as the average size of matrix grains increases, the driving force for grain growth abruptly decreases. That is, when the average size of matrix grains of the polycrystalline body is $2R_c$ or more, the growth rate of single crystals becomes too slow, so that a single crystals having a large size such as about 30~80 mm size or a size more than about 50 mm and about 80 mm or less cannot be produced.

It is noted that the average size (R) of matrix grains is related to the growth rate of single crystal, in particular, the tendency or behavior of the growth rate of single crystal. The average size between Rc and 2Rc can assure a growth rate of single crystal to obtain a single crystal having a large size such as about 30~80 mm size or a size more than about 50 mm and about 80 mm or less.

However, if the growth rate becomes small from the point of the graph which corresponds to 2Rc, it is hard for the single crystal to reach the large size notwithstanding the heat treatment. Even if the abnormal grain growth does not occur in the polycrystalline body, single crystals big enough for practical use cannot be produced because the growth rate of single crystal is too slow in the polycrystalline body.

Therefore, it is necessary to make the average grain size within the range (Rc<R<2Rc) before the heat treatment in order to obtain the large single crystal enough for practical use having several cm such as about 30~80 mm size or a size more than about 50 mm and about 80 mm or less without occurrence of abnormal grain growth in the polycrystalline body.

For reference, it is shown in FIG. 2 that the number density of abnormal grains and a degree of the seed single grain growth vary as the average size of matrix grains varies in the polycrystalline body. Referring to FIG. 2, if R is larger than $R_c$, no abnormal grains exist.

By making the average size of matrix grains to be within a specific range in which the abnormal grain growth is prevented and does not exist in the polycrystalline body but the driving force for grain growth is sufficiently large, by adjoining the seed single crystal to the exterior of the polycrystalline body and by heat treating the seed single crystal and polycrystalline body, it is possible to produce a single crystal having composition of the polycrystalline body and having a large size enough for practical use having several cm such as about 30~80 mm size or a size more than about 50 mm and about 80 mm or less.

The adjoining of the seed single crystal to the polycrystalline body may include placing the seed single crystal on the powder-molded body or the polycrystalline body, embedding the seed single crystal in the powder, or embedding the combination of the seed single crystal and the polycrystalline body in the powder.

A polycrystalline thin film may be grown by using a method of producing a polycrystalline thin film, and then the average size of matrix grains in the polycrystalline thin film during or after the thin film growth may be adjusted.

A new thin film single crystal may be produced by continuously growing a seed single crystal into the polycrystalline thin film during heat treatment.

In addition, in embodiments, the single crystal growth may be promoted by using a seed single crystal having a shape such as a simple plate-type or a rod-type, or a seed single crystal having a complex shape capable of making the growth rate of the seed single crystal be a maximum, such as "L" shape of a large crystal plane having a high growth rate.

A matrix grain growth can occur during the heat treatment of the polycrystalline materials. The matrix grain growth may be variously affected by chemical composition of the matrix grain, heat treatment temperature, type and amount of additives, type and amount of impurity, heat treatment atmosphere (particularly, oxygen partial pressure, degree of vacuum), density of polycrystalline body, pressure in pressure-sintering, etc.

In the method according to the embodiments, the heat treatment can be carried out checking the average size of the matrix grains within the specific range such that the abnormal grain growth is prevented and does not exist inside the polycrystalline body.

That is, when the average size of matrix grains of the polycrystalline body is smaller than $R_c$, the average size of matrix grains is increased to be included in the range ($R_c<R<2R_c$) or when the average size of matrix grains of the polycrystalline body is larger than $2R_c$, the average size of matrix grains is decreased to be included in the range ($R_c<R<2R_c$).

It is very useful to set forth the average size of matrix grains of the polycrystalline body within the range because it can be a strong means or useful criterion among the various individual factors to obtain a large single crystal (for example, a large single crystal enough for practical use having a size such as about 30~80 mm size or a size more than about 50 mm and about 80 mm or less) without considering each and every factors at the same time and without occurrence of abnormal grain growth in the polycrystalline body.

Further, in the method, a single crystal having composition of the polycrystalline body can be produced by adjoining again the single crystal prepared according to the method as a seed single crystal to a polycrystalline body, and then heat-treating the combination of the seed single crystal and the polycrystalline body, thereby continuing to grow the same structure as the seed single crystal into the polycrystalline body. As a result, a single crystal having composition of the polycrystalline body is produced.

Further, a single crystal to be grown from a seed single crystal in the polycrystalline body has the same crystallographic orientation as that of the seed single crystal, and when the defects are included in the seed single crystal, the growing single crystal also comprises the same defects.

Based on this phenomenon, the method for single crystal growth according to the embodiments may include grinding a specific crystal face of the seed single crystal in the crystallographic orientation, and adjoining the ground seed single crystal to the polycrystalline body, or adjoining a seed single crystal having specific defects (for example, single twin, double twin, grain boundary, etc.) to the polycrystalline body in order to easily produce single crystals having a desired specific crystallographic orientation and specific defects.

Further, the method according to the embodiments may include molding the polycrystalline body powder to a desired shape or processing the polycrystalline body into a complex shape, and then adjoining the shaped or processed polycrystalline body to the seed single crystal, to produce a single crystal having a desired complicated shape without a expensive and complex separate step for processing the single crystal, based on the theory that a single crystal completely grown from the seed single crystal into the polycrystalline body has the same shape as that of the polycrystalline body adjoined to the seed single crystal.

Further, the method according to the embodiments may include producing the polycrystalline body having porosity, pore shape and distribution of pore by controlling the heating temperature, heat treatment atmosphere (e.g., an oxygen partial pressure, a degree of vacuum), an external pressure during heat treating (pressure sintering), the amount of liquid phase and additives, adjoining the polycrystalline body to a seed single crystal, and then growing a single crystal, thereby making it possible to produce a single crystal having various pore structures. In addition, when a single crystal is grown in the perfectly dense polycrystalline body, perfectly dense single crystals free from pores can be grown in large quantities at low costs.

Further, single crystals of, for example, $BaTiO_3$ [BT], BT solid solution $((Ba_xM_{1-x})(Ti_yN_{1-y})O_3)$ (e.g., $Ba(Ti,Zr)O_3$ [BTZ], $Ba(Ti,Sn)O_3$ [BTS], $(Ba,Sr)TiO_3$ [BST]), $Pb(Zr_xTi_{1-x})O_3$ [PZT], $(Pb_y,La_{1-y})(Zr_xTi_{1-x})O_3$ [PLZT], $(100-x)Pb(Mg_{1/3}Nb_{2/3})O_3$-$(x)PbTiO_3$ [(100-x)PMN-(x)PT], (100-x)PMN-(x)BT, (100-x-y)PMN-xPT-yBT, (100-x-y)PMN-xPT-yPZ, solid solutions thereof, and single crystals having various compositions can be produced in large quantities at low costs by using a big seed single crystal having a size of more than 40×40 mm prepared according to the embodiments of the invention.

Hereinafter, examples of a method according to the embodiments will be described in detail.

EXAMPLE 1

$Ba(Ti,Zr)O_3$ has excellent dielectric, piezoelectric and electro-optical properties and is used as a core material of the various kinds of electronic parts.

In this Example, $Ba(Ti,Zr)O_3$ was used as the polycrystalline body, and $Ba(Ti,Zr)O_3$ having one or more components higher or lower than those of the original composition thereof was subject to heat treatment, thereby causing the average size of matrix grains change. In the example, abnormal grain growth was monitored.

$Ba(Ti,Zr)O_3$ powders were prepared by mixing $BaCO_3$, $TiO_2$ and $ZrO_2$ powders and then calcining the mixture at 1200° C. in air. The powders having various compositions comprising excess $TiO_2$ were prepared by adding excess $TiO_2$ to the prepared $Ba(Ti,Zr)O_3$ powder in the amount of more than 0.0 mol % to less than 0.5 mol %.

Then, the powders comprising added $TiO_2$ were molded in a quadrangle mold and the molded powders were subject to cold isostatic pressing at the pressure of 200 MPa. The powder-molded bodies were subject to heat-treating at the temperatures higher than 1300° C. for up to 200 hours in the air.

A $Ba(Ti_{0.7}Zr_{0.3})O_3$ seed single crystal was placed on the prepared polycrystalline body, and the combination was subject to heat-treating at 1380° C. for up to 200 hours.

Figure 3:
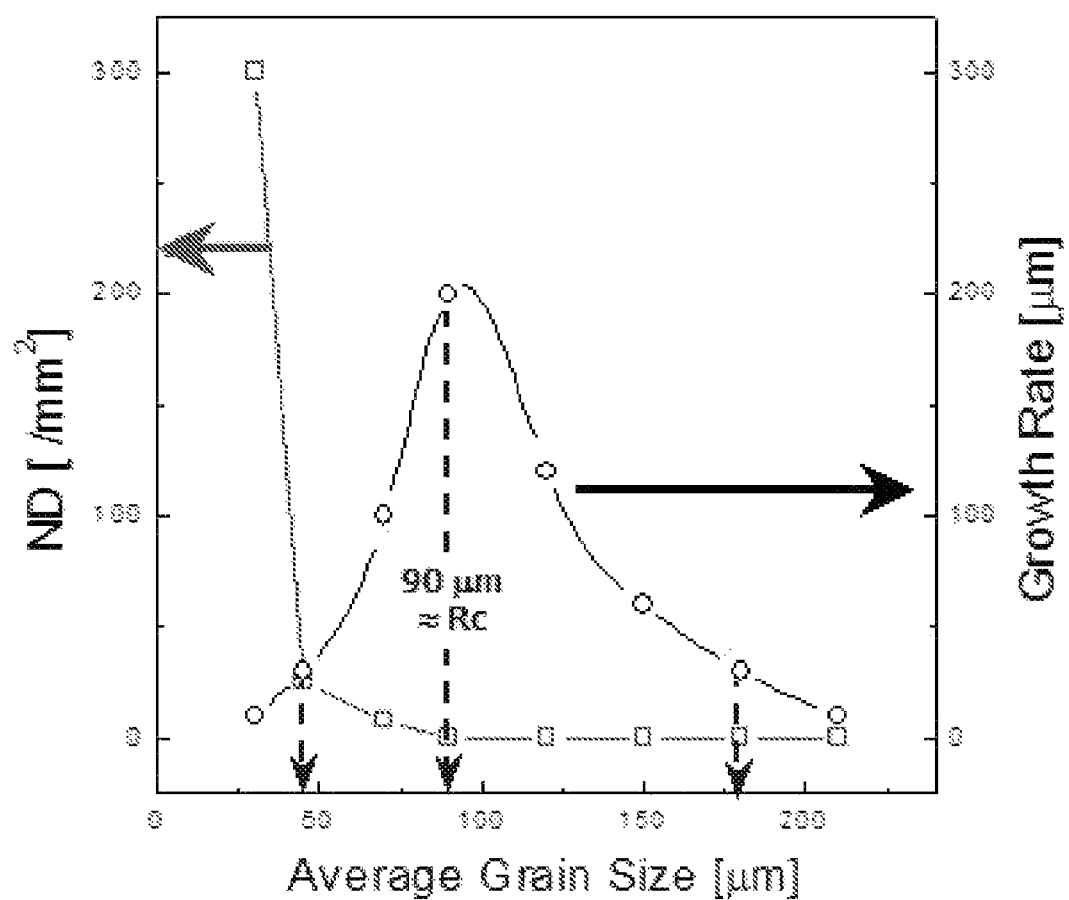
FIG. 3 is a graph showing the correlations between the average size (R) of matrix grains and the number density (ND) of abnormal grains generated in the polycrystalline body, and between the average size (R) of matrix grains and a growth rate of the seed single crystal into the polycrystalline body, in a sample prepared by heat treating $Ba(Ti_{0.7}Zr_{0.3})O_3$ polycrystalline body [(100-x)$Ba(Ti_{0.7}Zr_{0.3})O_3$-x$TiO_2$ ($0 \leq x \leq 1$)] at 1380° C. for 15 hours.

FIG. 3 is a graph showing the correlations between the average size (R) of matrix grains and the number of the abnormal grains generated in the polycrystalline body, and between the average size (R) of matrix grains and a growth rate of a seed single crystal into the polycrystalline body, in a sample obtained by heat treating the powder molded bodies having the composition formula of $Ba(Ti_{0.7}Zr_{0.3})O_3$ [(100-x)$Ba(Ti_{0.7}Zr_{0.3})O_{3-x}TiO_2$; $0 \leq x \leq 1$] composition, to which $TiO_2$ was added in the amount of more than 0.0 mol % to less than 0.5 mol % at 1380° C. for 15 hours in the air.

When excess $TiO_2$ powder of more than 0.0 mol % to less than 0.5 mol % was added to $Ba(Ti_{0.7}Zr_{0.3})O_3$ powder and then the powders were sintered, the size of matrix grains continuously decreased as the amount of $TiO_2$ increased. When $TiO_2$ Of more than 0.0 mol % to less than 0.5 mol % was added, an abnormal grain growth did not occur in the polycrystalline body while the size of abnormal grains varied from a critical size ($R_c$) of matrix grains for abnormal grain growth ($Rc \approx 90$ μm) to about $2R_c$.

In the sample of $(99.8)Ba(Ti_{0.7}Zr_{0.3})O_3$-$(0.2)TiO_2$, the size of matrix grains was so large that the abnormal grain growth did not occur in the polycrystalline body.

In FIG. 3, the average sizes of matrix grains having the respective compositions is (a) 210 μm [$(99.8)Ba(Ti_{0.7}Zr_{0.3})O_3$-$(0.2)TiO_2$], (b) 90 μm [$(99.8)Ba(Ti_{0.7}Zr_{0.3})O_3$-$(0.5)TiO_2$], respectively, the critical size ($R_c$) of matrix grains for abnormal grain growth was about 90 μm.

In the sample of [$(99.8)Ba(Ti_{0.7}Zr_{0.3})O_3$-$(0.2)TiO_2$] in which the average size of matrix grains is twice or more (i.e. 180 μm or more) of the critical size, the abnormal grain growth did not occur. However, the driving force for grain growth was so small that the growth rate of the seed single crystal was 30 μm/h or less.

In the case that the growth rate of the seed single crystal was 30 μm/h or less, single crystals large enough for practical use could not be produced even though the heat treatment was carried out for long hours. Accordingly, this case was not suitable for producing the large single crystals.

As a result, when the relation between the average size of matrix grains and the single crystal growth was examined, it was possible to grow the seed single crystal without the occurrence of abnormal grain growth to a large size of several tens mm such as about 50 mm to 80 mm only if the size of matrix grains was more than 90 μm to less than 180 μm, preferably less than 150 μm (FIG. 3)

Accordingly, the range of the average size (R) of matrix grains, in which the seed single crystal can continue to be grown to have a enough large size for practical use without the occurrence of the abnormal grain growth, associated with the critical size ($R_c$ in FIG. 1) of matrix grains for abnormal grain growth as follows; $R_c < R < 2R_c$.

Figure 4:
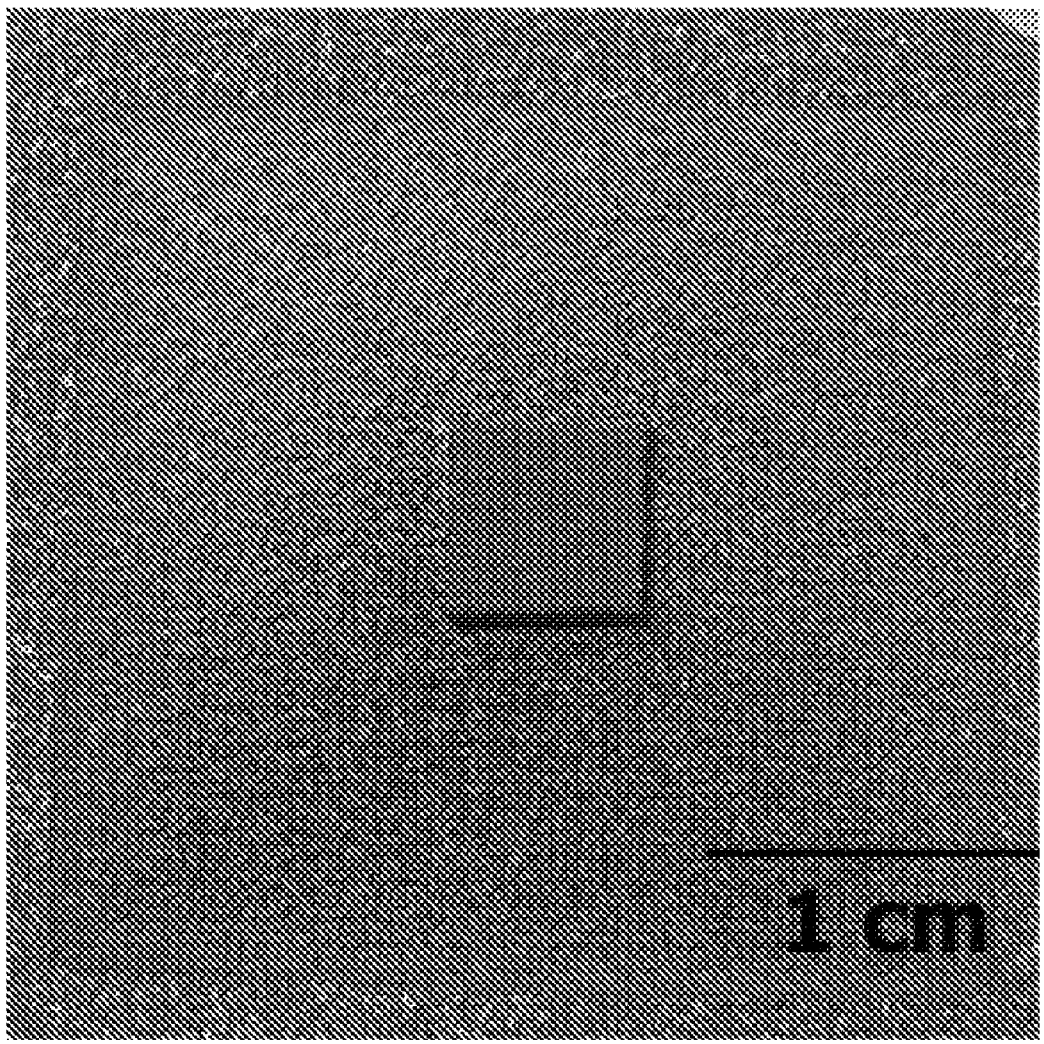
FIG. 4 is a photograph showing a single crystal grown from a sample obtained by placing a seed single crystal having the composition formula of $Ba(Ti_{0.7}Zr_{0.3})O_3$ on a polycrystalline body having the composition formula of (99.6)$Ba(Ti_{0.7}Zr_{0.3})O_3$-(0.4)$TiO_2$ [mol %], and then heat-treating the combination of the seed single crystal and the polycrystalline body at 1380° C. for 200 hours.

FIG. 4 is a photograph showing a single crystal grown from a sample obtained by placing a seed single crystal having the composition formula of $Ba(Ti_{0.7}Zr_{0.3})O_3$ on a polycrystalline body having the composition formula of $(99.6)Ba(Ti_{0.7}Zr_{0.3})O_3$-$(0.4)TiO_2$, and then heat-treating the combination at 1380° C. for 200 hours. In the sample [$(99.6)Ba(Ti_{0.7}Zr_{0.3})O_3$-$(0.4)TiO_2$] of FIG. 4 to which $TiO_2$ was added in the contents lower than the sample [$(99.5)Ba(Ti_{0.7}Zr_{0.3})O_3$-$(0.5)TiO_2$] of FIG. 3 in which the size of matrix grains was similar to the critical size of matrix grains for abnormal grain growth by 0.1 mol %, since the size of matrix grains was slightly larger than the critical size ($R_c$ in FIG. 1), the abnormal grain growth did not occur inside the polycrystalline body.

Since the seed single crystal continued to grow into the polycrystalline body without colliding with the abnormal grains (because there were no abnormal grains) during the heat treatment, a large seed single crystal having a size of at least 20×20 mm or more was produced.

When the average size of matrix grains of the polycrystalline body was continuously decreased by adding excess $TiO_2$ powder to $Ba(Ti_{0.7}Zr_{0.3})O_3$ powder, it was possible to control the average size of matrix grains of the polycrystalline body to be slightly larger than the critical size ($R_c$ in FIG. 1) for abnormal grain growth in case of adding a specific amount of $TiO_2$ (FIG. 4).

In this case, the abnormal grain growth did not occur inside the polycrystalline body, and the seed single crystal continued to be grown into the polycrystalline body so that a big single crystal was produced in the polycrystalline body. The size of the produced single crystal was proportional to the heat treatment time. Preferably, the heat treat time is about 100 hours to 400 hours.

The range of the average size (R) of matrix grains, in which the seed single crystal can be grown to have a enough large size for practical use without the occurrence of the abnormal grain growth, was $R_c<R<2R_c$ ($R_c$: critical size of matrix grains for abnormal grain growth).

EXAMPLE 2

The average size of matrix grains of polycrystalline body is changed depending on the heat treatment atmosphere (e.g., air, oxygen, hydrogen, oxygen partial pressure, degree of vacuum). Based on this theory, in this example, the average size of matrix grains of the polycrystalline body was adjusted by primarily heat-treating only the polycrystalline body in the atmosphere different from the atmosphere for a single crystal growth prior to the secondary heat treatment for the single crystal growth.

When the average size of matrix grains of the polycrystalline body prepared in the primary heat treatment is controlled to be within the range of $R_c<R<2R_c$ under the condition of a secondary heat treatment, it is possible to continuously grow only the seed single crystal during the secondary heat treatment.

A polycrystalline body sample having the composition formula of $(99.2)Ba(Ti_{0.7}Zr_{0.3})O_3$-$(0.8)TiO_2$ was prepared. The powder comprising added 0.8 mol % $TiO_2$ was molded in a quadrangle mold and the molded powders were subject to cold isostatic pressing at the pressure of 200 MPa. The powder-molded body was subject to heat-treating at the temperatures higher than 1300° C. for up to 200 hours while changing the oxygen partial pressure ($PO_2$) of the heat treatment atmosphere.

When a polycrystalline body sample having the composition formula of $(99.2)Ba(Ti_{0.7}Zr_{0.3})O_3$-$(0.8)TiO_2$ was sintered at 1380° C. in the air atmosphere of oxygen partial pressure of 0.2, the average size of matrix grains was about 30 μm and the abnormal grain growth actively occurred.

When the sample was sintered at 1380° C. in the atmosphere of oxygen partial pressure of 0.01 or less, the average size of matrix grains was about 110 μm and the abnormal grain growth did not occur.

As the oxygen partial pressure decreased, the size of matrix grains of barium titanate-type polycrystalline body continued to increase.

Figure 5:
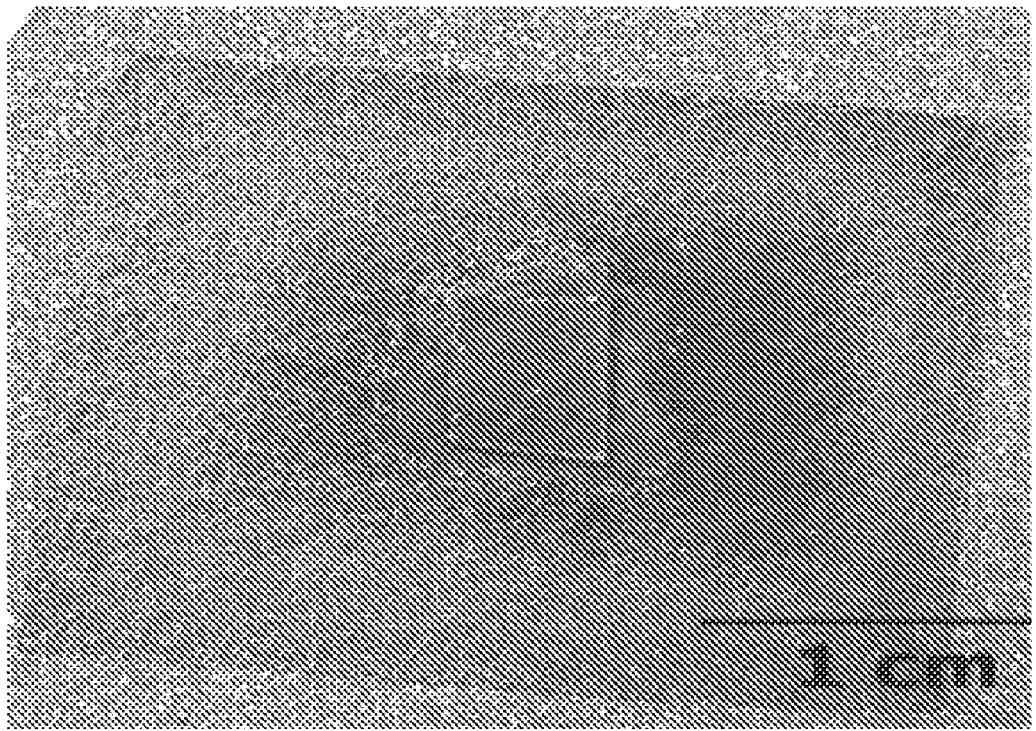
FIG. 5 is a photograph showing a sample obtained by sintering a polycrystalline body having the composition formula of (99.2)$Ba(Ti_{0.7}Zr_{0.3})O_3$-(0.8)$TiO_2$ at 1380° C. for 5 hours in the reductive atmosphere of oxygen partial pressure ($P_{O2}$) of 0.01 or less, placing a seed single crystal of $Ba(Ti_{0.7}Zr_{0.3})O_3$ on the sintered polycrystalline body, and then heat-treating the combination of the seed single crystal and the sintered polycrystalline body at 1380° C. for 200 hours in the air atmosphere.

FIG. 5 is a photograph showing a sample obtained by sintering a polycrystalline body sample having the composition formula of $(99.2)Ba(Ti_{0.7}Zr_{0.3})O_3$-$(0.8)TiO_2$ at 1380° C. for 5 hours in the reductive atmosphere of oxygen partial pressure of 0.01 or less, placing a seed single crystal of $Ba(Ti_{0.7}Zr_{0.3})O_3$ on the sintered polycrystalline body sample, and heat-treating the combination at 1380° C. for 200 hours in the air atmosphere.

When the sample having the composition formula of $(99.2)Ba(Ti_{0.7}Zr_{0.3})O_3$-$(0.8)TiO_2$ was sintered in the air, the seed single crystal was adjoined to the sintered sample, and then the combination of the seed single crystal and the sample was heat-treated, the seed single crystal could not be grown since the size of matrix grains was too small (i.e., $R<0.5R_c$), and thus the abnormal grain growth occurred and the number density of abnormal grains was too high.

When the seed single crystal was adjoined to the $(99.2)Ba(Ti_{0.7}Zr_{0.3})O_3$-$(0.8)TiO_2$ sample, and then the combination was subject to the heat treatment only in the reductive atmosphere of oxygen partial pressure of 0.01 or less, the seed single crystal could not be grown because the matrix grains continued to grow to such a size larger than $2R_c$, and thus the driving force for single crystal growth became too small.

However, the average size (R) of matrix grains of the polycrystalline body was made to be within the range of $R_c<R<2R_c$ under the condition of the secondary heat treatment by promoting a grain growth of the polycrystalline body in the atmosphere of low oxygen partial pressure.

After that, the seed single crystal and the polycrystalline body were adjoined together, and the combination was subject to the heat treatment for the purpose of growing single crystals in the air of high oxygen partial pressure so that an abnormal grain growth was not occurred in the polycrystalline body and the driving force for seed single crystal growth was maintained to be high.

As a result, the seed single crystal continued to be grown into the polycrystalline body as shown in FIG. 5. The seed single crystal growth was proportional to the heat treatment time, and $Ba(Ti_{0.7}Zr_{0.3})O_3$ single crystal having 25×25 mm or more was produced in the polycrystalline body through a heat treatment for long hours (FIG. 5).

As shown in FIG. 5, in the method for increasing the size of matrix grains in order for the abnormal grain growth not to occur in the polycrystalline body, based on the theory that the average size of matrix grains is changed depending on the heat treatment atmosphere, the polycrystalline body was subject to the primary heat treatment in the atmosphere promoting the grain growth to increase the size of the matrix grains, and then the heat treatment for the seed single crystal growth was carried out in the heat treatment atmosphere capable of continuing to grow the seed single crystal into the polycrystalline body. As a result, it was possible to produce a big single crystal having a size of several tens mm while effectively preventing the abnormal grain growth in the polycrystalline body.

EXAMPLE 3

In this , a single crystal having the composition of solid solution with solute substances non-uniformly dispersed therein was prepared.

In the Example 1, the single crystal and polycrystalline body of barium titanate solid solution prepared by uniformly dispersing and mixing $BaCO_3$, $TiO_2$ and $ZrO_2$ powders and having uniformly dispersed zirconia ($ZrO_2$) therein were produced.

In this Example, in order to prepare a single crystal with solute substances non-uniformly dispersed therein, firstly, a polycrystalline body of solid solution with solute substances non-uniformly dispersed therein were prepared by preparing barium titanate powders comprising the respective solute substances, and depositing them in regular order in a mold. As the additives to be used for preparing a single crystal of barium titanate solid solution having the composition formula of $((100-x)BaTiO_3$-$(x)MO$ [mol %]), one or more additives selected from the group consisting of $Bi_2O_3$, CaO, CdO, $CeO_2$, CoO, $Cr_2O_3$, $Fe_2O_3$, $HfO_2$, $K_2O$, $La_2O_3$, MgO, $MnO_2$, $Na_2O$, $Nb_2O_5$, $Nd_2O_3$, NiO, PbO, $Sc_2O_3$, $SmO_2$, $SnO_2$, SrO, $Ta_2O_5$, $UO_2$, $Y_2O_3$, ZnO, and $ZrO_2$ which are known to be solid-solutioned into barium titanate are added to the polycrystalline body. A disc-type powder-molded body having a diameter of 15 mm and a height of 7 mm was prepared with 2.5 g powder prepared by mixing barium titanate and the powder of additive (MO) and having the composition formula of $(100-x)BaTiO_3$-$(x)$ MO (mol %), and then was subject to cold isostatic pressing at the pressure of 200 MPa.

The prepared solid solution powder-molded body was subject to heat-treating at the atmosphere of oxygen partial pressure of 0.01 or less to increase the size matrix grains of the polycrystalline body, and then was subject to heat-treating at 1360° C. for 100 hours in the atmosphere of oxygen partial pressure of 0.2, thereby causing a single crystal having the composition of solid solution to be produced.

Figure 6:
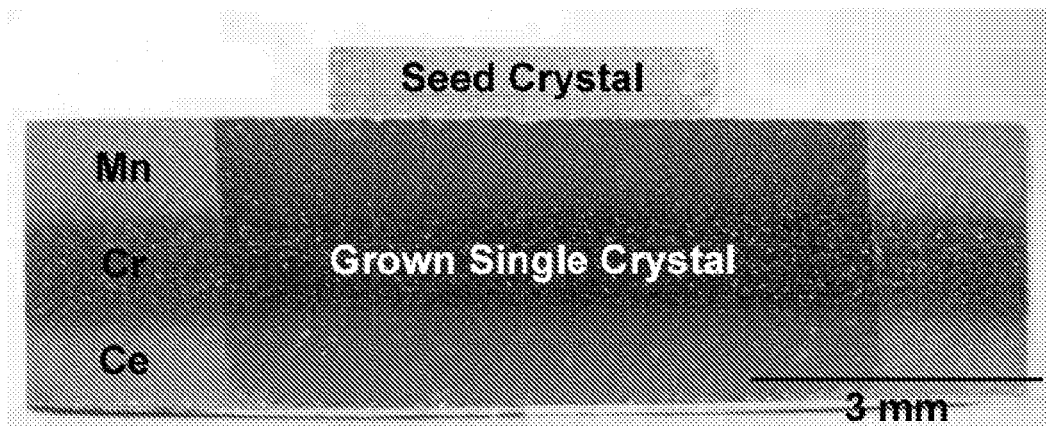
FIG. 6 is a photograph showing a cross-section of a sample obtained by depositing powders having the composition formulas of (99.8)$BaTiO_3$-(0.2)$MnO_2$, (99.8)$BaTiO_3$-(0.2)$NbO_{2.5}$ and (99.8)$BaTiO_3$-(0.2)$CeO_2$ [mol %] in regular order, primarily sintering the powder-molded body at 1370° C. for 5 hours in the atmosphere of oxygen partial pressure ($P_{O2}$) of 0.01, placing a seed single crystal of barium titanate on the sintered body, and then heat-treating the combination of the seed single crystal and the sintered body at 1370° C. for 100 hours in the atmosphere of oxygen partial pressure of 0.2.

FIG. 6 is a photograph showing a cross-section of a sample obtained by depositing powders having the composition formulas of (99.8)BaTiO$_3$-(0.2)MnO$_2$, (99.8)BaTiO$_3$-(0.2)NbO$_{2.5}$ and (99.8)BaTiO$_3$-(0.2)CeO$_2$ [mol %] in regular order, respectively, primarily sintering the molded body at 1370° C. for 5 hours in the atmosphere of oxygen partial pressure of 0.01, placing a seed single crystal of barium titanate on the sintered body, and then heat-treating the combination of the seed single crystal and the sintered body at 1370° C. for 100 hours in the atmosphere of oxygen partial pressure of 0.2.

The matrix grain growth was promoted in the polycrystalline body of barium titanate solid solution when the polycrystalline body had been sintered in the atmosphere of oxygen partial pressure ($P_{O2}$) of 0.01.

However, the abnormal grain growth did not occur even if the polycrystalline body was again subject to heat-treating in the atmosphere of oxygen partial pressure ($P_{O2}$) of 0.2.

When the seed single crystal of barium titanate was placed on the polycrystalline body having a composition gradient and sintered in the atmosphere of oxygen partial pressure of 0.01 (i.e., the sintered body prepared by depositing powders having the compositions formulas of (99.9)BaTiO$_3$-(0.2)MnO$_2$, (99.9)BaTiO$_3$-(0.2)NbO$_{2.5}$, and (99.9)BaTiO$_3$-(0.2)CeO$_2$ [mol %] in regular order), and the combination of the seed single crystal and the polycrystalline body was subject to heat-treating at 1370° C. for 100 hours in the atmosphere of oxygen partial pressure of 0.2, the seed single crystal was firstly grown into a portion comprising MnO$_2$, and then continued to be grown a portion comprising NbO$_{2.5}$ and CeO$_2$.

In this manner, a single crystal of barium titanate solid solution having a discontinuous composition gradient and consisting of non-doped barium titanate, Mn solid solution, Nb solid solution and Ce solid solution was obtained.

When the size of matrix grains of the polycrystalline body having the composition of solid solution was controlled to have $R_c<R<2R_c$ by controlling the atmosphere, it was possible to continuously grow the seed single crystal into the polycrystalline body and to produce a single crystal having the composition of solid solution and a size of several tens mm and a single crystal of solid solution compositions having a composition gradient.

It is clearly advantageous to produce a single crystal having a composition gradient, which is difficult to be produced by a general Liquid-State Single Crystal Growth method due to the composition gradient therein.

EXAMPLE 4

Preparation of Single Crystal Having Specific Crystallographic Orientation and Defects A single crystal to be grown from a seed single crystal in the polycrystalline body has the same crystallographic orientation as the seed single crystal, and when defects are included in the seed single crystal, the growing single crystal also comprises the same defects.

In this Example, based on this theory, it was shown that a single crystal having a desired specific crystallographic orientation and a single crystal comprising desired specific defects (for example, single twin, double twin, grain boundary, etc.) could be easily produced by grinding a specific crystal face of a seed single crystal in the crystallographic orientation, and then adjoining the ground seed single crystal to the polycrystalline body, or adjoining a seed single crystal having specific defects to the polycrystalline body. In this Example, the polycrystalline body of barium titanate having the composition formula of (99.6)BaTiO$_3$-(0.4)ZrO$_2$ was used.

Figure 7A:
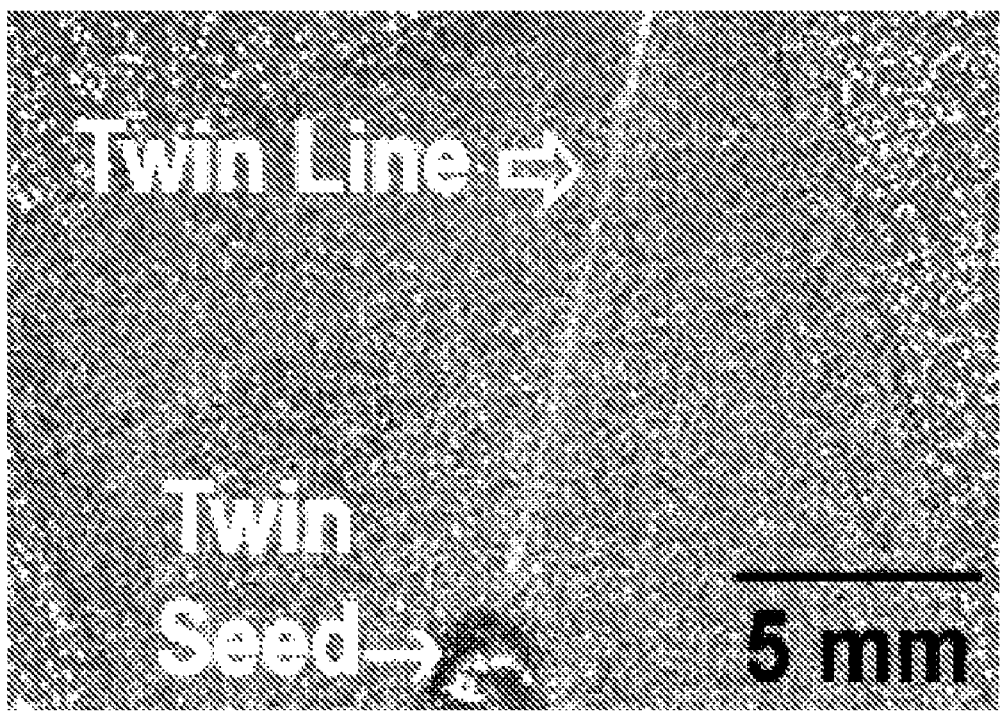
FIGS. 7a and 7b are photographs showing samples obtained by placing (a) a single crystal of barium titanate comprising a (111) double twin and (b) two rod-type single crystals of barium titanate which were turned by an angle of about 10° after separating one rod single crystal into two single crystals, on a powder-molded body having the composition formula of (99.6)$BaTiO_3$-(0.4)$ZrO_2$, and then heat-treating the combination at 1380° C. for 200 hours.
Figure 7B:
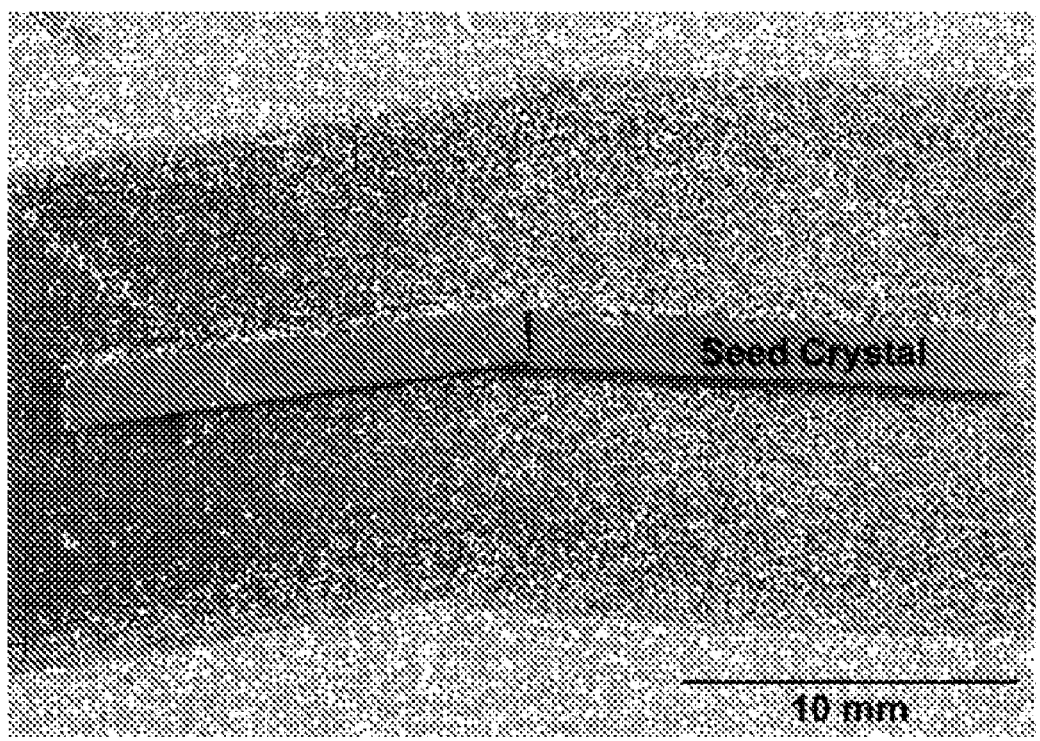

FIGS. 7a and 7b are photographs showing samples obtained by placing (a) a single crystal of barium titanate comprising a (111) double twin and (b) two rod-type single crystals of barium titanate which were turned by an angle of about 10° after separating one rod single crystal into two single crystals, on the powder-molded body having the composition formula of (99.6)BaTiO$_3$-(0.4)ZrO$_2$, and then heat-treating the combination at 1380° C. for 200 hours. When (a) the single crystal comprising (111) double twin and (b) the rod-type single crystals which were turned by about 100 were used, the single crystal grown from the seed single crystal had also the same defects as those of the seed single crystal. When the single crystals comprising defects such as a (111) double twin and low angle grain boundaries are desired to be produced as in this Example, it was shown that it was possible to produce the single crystals comprising desired defects if the seed single crystal comprising desired defects was produced.

In particular, it is possible to produce bi-crystals with specific crystallographic orientations by simultaneously using at least two single crystals and by use of the seed single crystal comprising the same defects.

As described above, the method for growing single crystals according to the embodiments of the invention has some advantages to provide a manufacturing process for single crystals such as single crystals of undoped barium titanate, single crystals of barium titanate solid solution, PZT single crystals, PZT single crystals of solid solution, PMN-PT single crystal, and PMN-PT single crystals of solid solution by using a general and simple heat treatment method without special equipments or skilled functions, as a result of which a large amount of single crystals large enough for practical uses of more than several cm can be produced at a low cost without occurrence of the abnormal grain growth. This method for growing single crystals according to the embodiments of the invention allows a growth of single crystals without a limitation in the size of the single crystal and provides high reproducibility of the single crystals with a composition gradient. The method also makes it possible to control the porosity of the single crystal, and the size and shape of pores, and prepare a complex single crystal from a polycrystalline body of a desired shape adjoined to the seed single crystal by heat treatment without a complicate step of processing a single crystal. This method can be efficient in the economical aspect because the final single crystals can be reused as a seed single crystal to produce various seed single crystals at a low cost, and also applicable to other materials showing an abnormal grain growth as well as barium titanate (BaTiO$_3$) and Pb-type perovskite.

While the invention has been shown and described with reference to certain embodiments thereof, it will be understood by those skilled in the art that various changes in form and details may be made therein without departing from the scope of the claimed invention.

What is claimed is:

1. A method for growing solid-state single crystals of materials without occurrence of abnormal grain growth in a polycrystalline body, comprising:

making an average size R of matrix grains of the polycrystalline body to have more than $R_c$ and less than $2R_c$, $R_c$ being a critical size of the matrix grains at which abnormal grain growth ends and the number density of the abnormal grains become zero;

adjoining a seed single crystal to the polycrystalline body; and heat-treating the seed single crystal and polycrystalline body to continue to grow the seed single crystal into the polycrystalline body.

2. The method according to claim 1, wherein the single crystal has a size of about 30 mm to about 80 mm.

3. The method according to claim 1, wherein the polycrystalline body is selected from the group consisting of $BaTiO_3$; $BaTiO_3$ solid solution $((Ba_xM_{1-x})(Ti_yN_{1-y})O_3)$ ($0 \leq x \leq 1$; $0 \leq y \leq 1$)); (1-x) $[Pb(Mg_{1/3}Nb_{2/3})O_3]$-x$[PbTiO_3]$ ($0 \leq x \leq 1$) (PMN-PT); PMN-PT solid solution; $Pb(Zr_xTi_{1-x})O_3$ ($0 \leq x \leq 1$) (PZT); PZT solid solution $(((Pb_x, M_{1-x})(Zr_aTi_bN_c)O_3$ ($0 \leq x \leq 1$; $0 \leq a, b, c \leq 1$; $a+b+c=1$))); (1-x-y) $[Pb(Mg_{1/3}Nb_{2/3})O_3]$-x$[PbTiO_3]$-y$[PbZrO_3]$ ($0 \leq x \leq 1$; $0 \leq y \leq 1$; $0 \leq x+y \leq 1$) (PMN-PT-PZ); PMN-PT-PZ solid solution; (1-x-y) $[Pb(Yb_{1/2}Nb_{1/2})O_3]$-x$[PbTiO_3]$-y$[PbZrO_3]$ ($0 \leq x \leq 1$; $0 \leq y \leq 1$; $0 \leq x+y \leq 1$) (PYbN-PT-PZ); PYbN-PT-PZ solid solution; (1-x-y) $[Pb(In_{1/2}Nb_{1/2})O_3]$-x$[PbTiO_3]$-y$[PbZrO_3]$ ($0 \leq x \leq 1$; $0 \leq y \leq 1$; $0 \leq x+y \leq 1$) (PIN-PT-PZ); PIN-PT-PZ solid solution; (1-x-y) $[Pb(Mg_{1/3}Nb_{2/3})O_3]$-x $[Pb(Yb_{1/2}Nb_{1/2})O_3]$-y$[PbTiO_3]$ ($0 \leq x \leq 1$; $0 \leq y \leq 1$; $0 \leq x+y \leq 1$) (PMN-PYbN-PT); PMN-PYbN-PT solid solution; (1-x-y) $[Pb(Mg_{1/3}Nb_{2/3})O_3]$-x$[Pb(In_{1/2}Nb_{1/2})O_3]$-y$[PbTiO_3]$ ($0 \leq x \leq 1$; $0 \leq y \leq 1$; $0 \leq x+y \leq 1$) (PMN-PIN-PT); PMN-PIN-PT solid solution; $K(Na_{0.5}Nb_{0.5})O_3$ [KNN]; KNN solid solution; $(Na_{0.5}Bi_{0.5})TiO_3$—$BaTiO_3$ [NBT-BT]; and [NBT-BT] solid solution.

4. The method according to claim 1, wherein the seed single crystal is grown by generating or adjoining a polycrystalline thin film onto a surface of the seed single crystal, the average size of matrix grains of the polycrystalline thin film being controlled to continue to grow the seed single crystal into the polycrystalline thin film so that a thin film single crystal may be formed on the seed single crystal.

5. The method according to claim 1, wherein the seed single crystal comprises defects such as a single twin boundary, a double twin boundary and a low angle grain boundary, thereby producing a single crystal comprising the same defects as those of the seed single crystal.

6. The method according to claim 1, wherein the polycrystalline body comprises pores, the seed single crystal is placed on the polycrystalline body comprising the pores, and a combination of the seed single crystal and the polycrystalline body is heat-treated to grow the single crystal having pores inside but not having pores on the surface thereof using a perfectly dense layer formed on the surface of the grown single crystal.

7. The method according to claim 1, wherein the polycrystalline body is powder-molded or processed to a desired shape, and the shaped or processed polycrystalline body is adjoined to the seed single crystal, thereby producing a single crystal having the desired shape without a separate step for processing the single crystal.

8. The method according to claim 1, wherein the polycrystalline body has a specific porosity, pore size and pore shape by adding an additive to the polycrystalline body or changing the amount of a liquid phase, sintering temperature, sintering atmosphere and sintering pressure during its production, the polycrystalline body is adjoined to the seed single crystal, and a combination of the polycrystalline body and the seed single crystal is heat-treated, thereby controlling the porosity, the pore size and the pore shape inside the single crystal to be grown in the polycrystalline body and producing perfectly dense single crystals destitute of pores or single crystals having various porosities.

9. The method according to claim 1, wherein the polycrystalline body is a polycrystalline body to which one or more additives forming a solid solution with a crystallographic structure of the polycrystalline body are added.

10. The method according to claim 1, wherein the polycrystalline body is a polycrystalline body to which one or more solutes to be solved into the crystallographic structure of the polycrystalline body are added and has a composition gradient that changes discontinuously or continuously.

11. The method according to claim 1, wherein the polycrystalline body is $BaTiO_3$ or $BaTiO_3$ solid solution $((BaxM1-x)(TiyN1-y)O3)$ ($0 \leq x \leq 1$; $0 \leq y \leq 1$)), and the average size of matrix grains of polycrystalline body is more than 90 μm and less than 180 μm.

* * * * *